United States Patent [19]

Igarashi et al.

[11] Patent Number: 5,674,922

[45] Date of Patent: Oct. 7, 1997

[54] ACTIVE ENERGY BEAM-CURABLE COMPOSITIONS COMPRISING OXETANE COMPOUNDS

[75] Inventors: Ichiro Igarashi, Nagoya; Hiroshi Sasaki, Tsukuba, both of Japan

[73] Assignee: Toagosei Co., Ltd., Tokyo, Japan

[21] Appl. No.: 680,610

[22] Filed: Jul. 16, 1996

[30] Foreign Application Priority Data

Jul. 21, 1995 [JP] Japan ................................ 7-207442

[51] Int. Cl.$^6$ ........................ C08F 2/50; C08L 63/02
[52] U.S. Cl. ..................... 522/168; 522/170; 522/31; 528/417; 528/421
[58] Field of Search .......................... 522/31, 32, 168, 522/170; 528/417, 421, 408, 409, 410, 411, 412, 413, 414, 415, 416

[56] References Cited

U.S. PATENT DOCUMENTS

| | | | |
|---|---|---|---|
| 3,463,789 | 8/1969 | Wojtowicz et al. | 260/333 |
| 3,835,003 | 9/1974 | Schlesinger et al. | 204/159.11 |
| 4,058,400 | 11/1977 | Crivello | 96/86 P |
| 4,806,613 | 2/1989 | Wardle | 528/59 |
| 4,833,183 | 5/1989 | Vandenberg | 524/35 |
| 5,362,848 | 11/1994 | Archibald et al. | 528/414 |
| 5,463,084 | 10/1995 | Crivello et al. | 549/214 |

FOREIGN PATENT DOCUMENTS 07-53711  2/1995  Japan .

OTHER PUBLICATIONS

H. Sasaki and J. Crivello; Journal of Macromolecular Science, vol. A29; No. 10; pp. 915–930; 1992.

J. Crivello and H. Sasaki; Journal of Macromolecular Science, vol. A30, No. 2, pp. 173–187; 1993.

J. Crivello and H. Sasaki; Journal of Macromolecular Science; vol. A30, No. 3, pp. 189–206; 1993.

*Primary Examiner*—Susan W. Berman
*Attorney, Agent, or Firm*—Heslin & Rothenberg, P.C.

[57] ABSTRACT

Active energy beam-curable compositions which comprise (1) at least one compound having one oxetane ring and one hydroxyl group in the molecule, (2) at least one compound having one or more oxirane rings in the molecule and (3) at least one compound which initiates cathionic polymerization by irradiation of active energy beams, are provided. The compositions can be rapidly cured by irradiation of active energy beams, such as ultraviolet rays and electron beams, to give excellent adhesion to basic materials.

5 Claims, No Drawings

ACTIVE ENERGY BEAM-CURABLE COMPOSITIONS COMPRISING OXETANE COMPOUNDS

BACKGROUND OF THE INVENTION

1. Field of the Invention

The invention relates to active energy beam-curable compositions which can be rapidly cured by irradiation of active energy beams, such as ultraviolet rays and electron beams, to provide cured products with excellent adhesion to basic materials.

2. Description of the Prior Art

Active energy beam-curing technology is very important in many industries, such as lumber coating, metal coating and printing, owing to its characterics, such as rapid curing rate, good workability, needing ordinarily no solvent and substantially low necessary amount of energy. In early stage of the development in these fields, an active energy beam-initiated radical polymerization of polyfunctional acrylates as well as unsaturated polyesters has been studied. A large amount of such materials has practically been used.

On the other hand, photo-initiated ionic polymerization is also well recognized to be promising in many application fields. Particularly, photo-initiated cathionic polymerization has something attractive about possibilities to realize a variety of chemical and physical properties by various monomer polymerizations. Furthermore, photo-initiated cathionic polymerization has an advantage in that the polymerization is effected readily and satisfactorily in the air, because it is not retarded by oxygen and needs no inert atmosphere.

As for photo-initiated cathionic polymerization, two kinds of monomers have so far been investigated, namely, epoxides having an oxirane ring which is a three-membered ring cyclic ether, and vinyl ether compounds.

Epoxides may be classified into three groups: aromatic epoxides, aliphatic epoxides and alicyclic epoxides. It has been known that photo-polymerization of aromatic epoxides, typically Bisphenol A, give coating agents having large heat-resistance, excellent adhesiveness and very good chemical resistance. It, however, is unavoidable from a disadvantage in slow photo-curing rate. Also, viscosity of most of them is so high that the viscosity has to be lowered by blending with monofunctional epoxide compounds as a reactive diluent. However, there has been a problem in that curing rate is even slower when the viscosity is lowered to a practical level, such as less than 5,000 cps. Aliphatic epoxides, for example, diglycidyl ether of ethylene glycol, also have a disadvantage in their low curing rates. While, alicyclic epoxides, such as 3,4-epoxycyclohexylmethyl-3,4-epoxycylohexylcarboxylate, are characterized by their very fast curing rate but they have a significant disadvantage of so called poor inner curability that is, when the coating film is thick, the surface part only is cured leaving an inside part uncured.

In order to improve curability of these epoxides, a method has been tried in which polyvalent alcoholic compounds are added to promote a chain-transfer reaction. The method is not satisfactory yet in that unaltered polyvalent alcohols tend to bleed on a coated surface, forming a coarse surface.

Another kind of the monomers, namely vinyl ether compounds, are characterized by fast curing rate. However, when the compounds have small viscosity, they easily evaporate to cause coating loss through evaporation of a part of the monomer during a period of curing, and also cause an odor problem.

Accordingly, the former photo-curable epoxides are hardly used for coatings of papers and plastics where rapid photo-curing is essential. Thus, active energy beam-curable compositions which retain the characteristics of epoxides and have practicable viscosities with a desirable curing rate have been highly desired.

The present inventors reported that polyfunctional oxetane monomers which have an oxetane ring, namely 4-membered ring cyclic ether, possess a photo-curability similar to or faster than the corresponding polyfunctional epoxides [Journal of Macromolecular Science, Vol. A29, No.10, Page 915 (1992); Ibid., Vol. A30, Nos. 2 & 3, Page 173 (1993); and Ibid., Vol. A30. Nos. 2 & 3, Page 189 (1993)]. They proposed rapidly curable and photo-curable compositions having monofunctional or polyfunctional oxetane monomers as a main component [JP 49907/1993, 214834/1993 and 223820/1993].

SUMMARY OF THE INVENTION

An object of the invention is to provide active energy beam-curable compositions which give smooth cured films with good adhesion and have a faster curing rate than yet to be attained.

In view of the state of art, the present inventors have made extensive studies, and accomplished the present invention. According to the present invention, it provides active energy beam-curable compositions which comprise (1) at least one compound having one oxetane ring and one hydroxyl group in the molecule, (2) at least one compound having one or more oxirane rings in the molecule and (3) at least one compound which initiates cathionic polymerization by irradiation of active energy beams. The compositions according to the invention give smooth cured films with good adhesion and have so large curing rate as not yet to be attained.

The invention will more fully be described hereinafter.

A. Compounds having One Oxetane Ring and One Hydroxyl Group in the Molecules

The compounds having one oxetane ring and one hydroxyl group in the molecules employed in the present invention (hereinafter referred to as "Compound A") may be any of those having one oxetane ring and one hydroxyl group in the molecules, preferably the compounds having the formula (1):

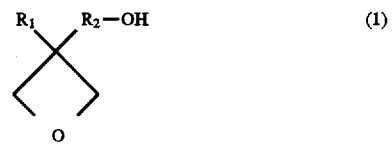

wherein $R_1$ represents a hydrogen atom, alkyl group having 1 to 6 carbon atoms, such as methyl, ethyl, propyl or butyl group, fluoroalkyl group having 1 to 6 carbon atoms, allyl group, aryl group, furyl group or thienyl group; and $R_2$ represents an alkylene group having 1 to 6 carbon atoms, such as methylene, ethylene, propylene or butylene group, or an alkylene group containing an ether linkage, for example, oxyalkylene group, such as oxyethylene, oxypropylene, or oxybutylene group.

In the formula (1), $R_1$ is preferably a lower alkyl group, more preferably an ethyl group, and $R_2$ is preferably a methylene group.

In the invention, two or more kinds of Compound A may be used combinedly.

B. Compounds having One or More Oxirane Rings in the Molecules

In the compounds having one or more oxirane rings in the molecules, which are one of the components of the present composition (hereinafter referred to as "Compound B"), the oxirane ring is shown in the following formula:

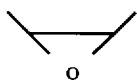

As Compound B, the compounds having an epoxy group may be either monomers or their oligomers. As the specific examples of Compound B, known aromatic epoxides, alicyclic epoxides and aliphatic epoxides are mentioned. Hereinafter, the term, "epoxide", means its monomers or oligomers. The oligomer compounds used in the invention are preferably those of a lower molecular weight, more preferably those having a molecular weight of smaller than 1,000.

Preferable aromatic epoxides are di- and polyglycidyl ethers which are prepared through a reaction of polyvalent phenols having at least one aromatic nucleus, or their alkylene oxide adducts, with epichlorohydrin. They are, for example, di- and polyglycidyl ethers of Bisphenol A or its alkylene oxide adducts, di- and polyglycidyl ethers of hydrogenated Bisphenol A or its alkylene oxide adducts, Novolak type epoxide resins, or the like. The alkylene oxides are ethylene oxide, propylene oxide, or the like.

Preferable alicyclic epoxides are those containing cyclohexene-oxide or cyclopenteneoxide, which are obtained by epoxylation of compounds having at least one cycloalkene ring such as cyclohexene or cyclopentene ring with oxidizing agents such as hydrogen peroxide or peracids. There may be exemplified the following compounds:

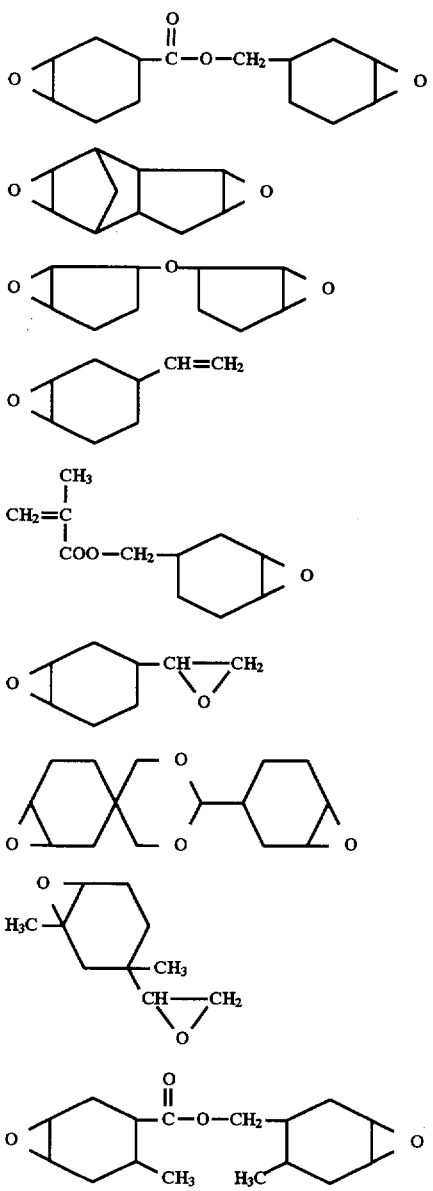

-continued

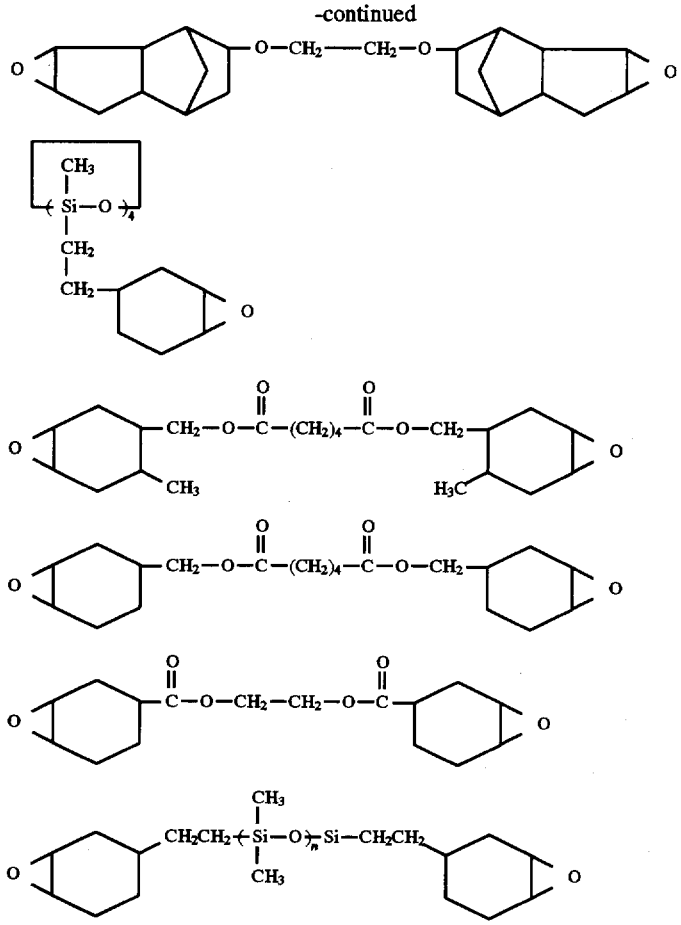

Preferable aliphatic epoxides, are, for example, di- or polyglycidyl ethers of aliphatic polyvalent alcohols or their alkylene oxide adducts. Mention is made of, for example, digycidyl ethers of alkylene glycols, such as diglycidyl ether of ethylene glycol, diglycidyl ether of propylene glycol or diglycidyl ether of 1,6-hexanediol; polyglycidyl ethers of polyvalent alcohols, such as di- or triglycidyl ethers of glycerol or its alkyleneoxide adducts; and diglycidyl ethers of polyalkylene glycols, such as diglycidyl ether of polyethylene glycol or its alkylene oxide adducts or diglycidyl ether of polypropylene glycol or its alkylene oxide adducts. The alkylene oxide is ethylene oxide, propylene oxide, or the like.

Besides these compounds, monoglycidyl ethers of aliphatic higher alcohols, or monoglycidyl ethers of phenol or cresol, which are monomers having one oxirane ring in their molecules, may be used.

From the viewpoint of curability, preferable Compound B includes aromatic or alicyclic epoxides, the latter being more preferred. Particularly, such alicyclic epoxides used along with Compound A give satisfactory results, namely rapid curability, as well as excellent inner curability which can hardly be attained by single use of alicyclic epoxides.

In the invention, two or more kinds of Compound B may be used combinedly.

C. Compounds Initiating Cathionic Polymerization by Irradiation of Active Energy Beams As for compounds which initiate cathionic polymerization by irradiation of active energy beams (hereinafter referred to as "Compound C"), any of various known cathionic photo-polymerization initiators are used. Preferable initiators are diaryl iodonium salts, triaryl sulfonium salts, or the like. Typical photo-polymerization initiators are as follows:

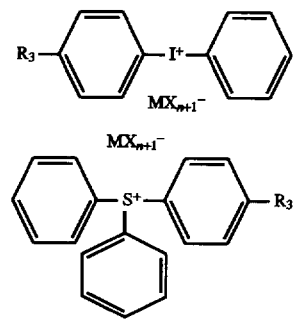

wherein $R^3$ represents a hydrogen atom, alkyl group having 1 to 18 carbon atoms, or alkoxyl group having 1 to 18 carbon atoms; M shows a metal atom, preferably antimony; X shows a halogen atom, preferably fluorine; and n is a valent number of the metal, for example, 6 in case of antimony.

D. Other Components

Besides the above essential components, the compositions of the present invention may have one or more such inactive components as inorganic fillers, dyes, pigments, viscosity adjusters, various treating agents and/or UV-shielders.

In order to improve curability of the compositions of the present invention when visible rays or ultraviolet rays are applied, photosensitizers may be blended besides the compound C. Typical sensitizers employable in the invention include the compounds disclosed in Adv. in Polymer Sci., 62, 1 (1984) by Crivello. They are, for example, pyrene, perylene, acridine orange, thioxanthone, 2-chlorothioxanthone, benzoflavine, or the like.

E. Method for Preparation

The active energy beam-curable compositions of the present invention, are prepared by mixing the compounds A, B and C as mentioned above according to a conventional procedure. An amount of the compound A is preferably 5 to 50 parts by weight, more preferably 10 to 40 parts by weight, on the basis of 100 parts by weight of total amounts of the compounds A and B. If an amount of the compound A is smaller than 5 parts by weight, curing rate and adhesion of the composition are insufficient. If an amount of the comound A is greater than 50 parts by weight, rapid curing rate is sometimes lost. The compound C is preferably 0.01 to 20 parts by weight, more preferably 0.1 to 10 parts by weight, on the basis of 100 parts by weight of total of the compounds A and B. If an amount of the compound C is smaller than 0.01 part by weight, the composition can hardly be cured sufficiently. If an amount of the compound C is greater than 20 parts by weight, light transmittance of the cured product is damaged, and even curing is not obtained.

The mixing ratio of the compounds A and B may be determined practically within the above ranges, considering the desired viscosity of the composition, hardness of the cured product, etc.

F. Method of Use

The compositions of the present invention are readily cured by irradiation of active energy beams, such as ultraviolet rays or electron beams.

Ultraviolet ray irradiation is effected using various kinds of light sources, for example, mercury arc lamps, xenon arc lamps, fluorescent lamps, carbon arc lamps, tungsten-halogen copying lamps, or the sun. In case of ultraviolet ray irradiation, the composition is usually cured with irradiation strength of at least 0.01 Watt per square centimeter of the basic materials within 1 to 20 seconds. The curing is preferably conducted continuously on a paper or metal coating line. In case of curing by electron beam irradiation, the curing is effected normally by electron beams of an energy of not greater than 300 eV. Instantaneous curing at an irradiation amount of 1 to 5 Mrad is also possible.

The compositions of the present invention are applied to many kinds of materials, such as metals, rubbers, plastics, molded parts, films, papers, woods, glass textiles, concretes, ceramics, or the like.

The compositions of the present invention are used for, for example, paints for wood-workings, paints for plastics, paints for metals, paints for papers, luster varnish, coatings for protection, decoration and insulation, paints for optical fibers, injection sealing compounds, printing inks, sealants, adhesives, photoresists, wire-insulating materials, textile coatings, laminates, impregnated tapes, printed plates, etc.

DESCRIPTION OF PREFERRED EMBODIMENTS

The invention will more specifically be described in reference to working and comparative examples, in which "part" is by weight, unless otherwise identified.

EXAMPLE 1

To a mixture of 10 parts of the following compound (2), as the compound A, and 85 parts of diglycidyl ether of Bisphenol A, as the compound B, was added and mixed 5 parts of the following Compound (3), as the compound C, to prepare an active energy beam-curable composition.

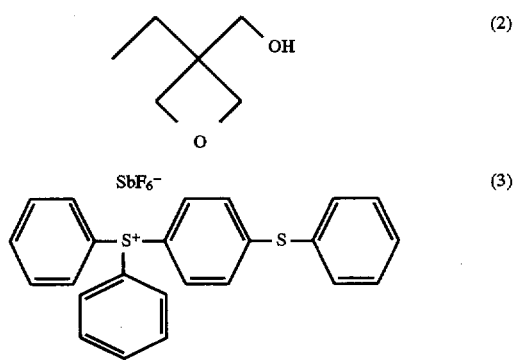

The resulting composition was applied onto a steel plate so as to make an about 20 micron thick coating. Using a conveyor type ultraviolet irradiation device provided with a high pressure mercury lamp of 80 W/cm (lamp height=10 cm, conveyor speed=10 m/min., irradiation strength: 310 mW/cm$^2$, 76 mJ/cm$^2$), pass number until the surface stickiness disappears was measured (one pass being 10 m/min.).

The resulting cured coating was evaluated for the adhesion by a cellophane tape peeling-off on a 100 gridiron (each 1 mm square) checkerboard. The numbers as the evaluation results show the remaining coated gridiron numbers after the cellophane tape peeling-off. Also, state of the cured film coating was observed by eye.

The results of the measurement of curing rate and the evaluation of adhesion, of the resulting composition are shown in Table 1.

EXAMPLES 2 and 3

To mixtures of the compound (2), as the compound A, and the following compound (4), as the compound B, in the proportions as shown in Table 2, was added and mixed 1 part of the compound (3), as the compound C, to prepare active energy beam-curable compositions. The resulting compositions were evaluated in the same way as in Example 1, except that the conveyor speed in the ultraviolet curing was 50 m/min. (one pass being 50 m/min.). The results are shown in Table 2.

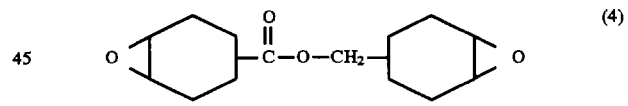

Comparative Example 1

Using the compounds B and C in the proportion as shown in Table 1, a composition was prepared and evaluated in the same way as in Example 1. The results are also shown in Table 1.

Comparative Examples 2 to 4

Using the compounds A, B and C and another component in the proportions as shown in Table 2, compositions were prepared and evaluated in the same way as in Example 2. The results are also shown in Table 2.

The compositions according to the present invention are rapidly curable by irradiation of active energy beams, such as ultraviolet rays and electron beams, even if they have low viscosity, and they are excellent in the adhesion to many kinds of materials. Accordingly, they can be utilized in paints for wood-workings, paints for plastics, paints for metals, paints for papers, luster varnish, coatings for protection, decoration and insulation, paints for optical fibers, injection sealing compounds, printing inks, sealants, adhesives, photoresists, wire-insulting materials, textile coatings, laminates, impregnated tapes, printed plates, etc., with significant impact to the industries.

TABLE 1

| | Compound A [part] | Compound B [part] | Compound C [part] | Curing rate * | Adhesion | State of film surface |
|---|---|---|---|---|---|---|
| Example 1 | Compound (2) [10] | Diglycidyl ether of bisphenol A [85] | Compound (3) [5] | 2 | 100 | Good |
| Comparative example 1 | — | Diglycidyl ether of bisphenol A [95] | Compound (3) [5] | 2 | 60 | Good |

* one pass 10 m/min

TABLE 2

| | Compound A [part] | Compound B [part] | Compound C [part] | Other [part] | Curing rate * | Adhesion | State of film surface |
|---|---|---|---|---|---|---|---|
| Example 2 | Compound (2) [10] | Compound (4) [89] | Compound (3) [1] | — | 1 | 100 | Good |
| Example 3 | Compound (2) [20] | Compound (4) [79] | Compound (3) [1] | — | 1 | 100 | Good |
| Comparative Example 2 | — | Compound (4) [99] | Compound (3) [1] | — | 1 | 0 | No good, fine winkless inside uncured |
| Comparative Example 3 | — | Compound (4) [79] | Compound (3) [1] | Triethylene glycol [20] | 4 | 55 | No good, coarse surface |
| Comparative Example 4 | Compound (2) [99] | — | Compound (3) [1] | — | >20 | — | No good, uncured |

* one pass = 50 m/min

What is claimed is:

1. An active energy beam-curable composition which comprises (1) at least one compound having one oxetane ring and one hydroxyl group in the molecule, (2) at least one compound having one or more oxirane rings in the molecule and (3) at least one compound which initiates cationic polymerization by irradiation of active energy beams.

2. A composition according to claim 1, wherein the compound having one or more oxirane rings in the molecule is an alicyclic epoxide.

3. A composition according to claim 1, wherein the compound having one or more oxirane rings in the molecule is an aromatic epoxide.

4. A composition according to claim 1 wherein (1) is 5–50 parts by weight and (3) is 0.01–20 parts by weight, both being on the basis of 100 parts by weight of total of (1) and (2), and (2) is remaining part.

5. A composition according to claim 4 wherein (1) is 10–40 parts by weight and (3) 0.1–10 parts by weight.

* * * * *

(12) EX PARTE REEXAMINATION CERTIFICATE (9637th)
United States Patent
Igarashi et al.

(10) Number: US 5,674,922 C1
(45) Certificate Issued: May 9, 2013

(54) ACTIVE ENERGY BEAM-CURABLE COMPOSITIONS COMPRISING OXETANE COMPOUNDS

(75) Inventors: Ichiro Igarashi, Nagoya (JP); Hiroshi Sasaki, Tsukuba (JP)

(73) Assignee: Toagosei Co., Ltd., Tokyo (JP)

Reexamination Request:
No. 90/012,487, Sep. 10, 2012

Reexamination Certificate for:
Patent No.: 5,674,922
Issued: Oct. 7, 1997
Appl. No.: 08/680,610
Filed: Jul. 16, 1996

(30) Foreign Application Priority Data

Jul. 21, 1995 (JP) ....................... 7-207442

(51) Int. Cl.
*C08F 2/50* (2006.01)
*C08G 59/14* (2006.01)
*C08G 59/40* (2006.01)
*C08G 59/62* (2006.01)
*C08G 65/16* (2006.01)
*C08G 65/18* (2006.01)
*G03F 7/038* (2006.01)
*C08G 59/00* (2006.01)
*C08G 65/00* (2006.01)
*C08G 59/68* (2006.01)
*C08L 63/02* (2006.01)

(52) U.S. Cl.
USPC ............. 522/168; 522/170; 522/31; 528/417; 528/421

(58) Field of Classification Search
None
See application file for complete search history.

(56) References Cited

To view the complete listing of prior art documents cited during the proceeding for Reexamination Control Number 90/012,487, please refer to the USPTO's public Patent Application Information Retrieval (PAIR) system under the Display References tab.

*Primary Examiner* — Alan Diamond

(57) ABSTRACT

Active energy beam-curable compositions which comprise (1) at least one compound having one oxetane ring and one hydroxyl group in the molecule, (2) at least one compound having one or more oxirane rings in the molecule and (3) at least one compound which initiates cathionic polymerization by irradiation of active energy beams, are provided. The compositions can be rapidly cured by irradiation of active energy beams, such as ultraviolet rays and electron beams, to give excellent adhesion to basic materials.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-5 are cancelled.

\* \* \* \* \*